(12) United States Patent
Usami

(10) Patent No.: US 7,737,756 B2
(45) Date of Patent: Jun. 15, 2010

(54) LEVEL SHIFT CIRCUIT

(75) Inventor: Shiro Usami, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/177,614

(22) Filed: Jul. 22, 2008

(65) Prior Publication Data

US 2009/0066397 A1    Mar. 12, 2009

(51) Int. Cl.
*H03L 5/00*    (2006.01)
(52) U.S. Cl. .......................... 327/333; 326/63; 326/81
(58) Field of Classification Search ............ 326/62–63, 326/80–81; 327/306, 333; 257/341, 331
See application file for complete search history.

(56) References Cited

U.S. PATENT DOCUMENTS

| | | | | |
|---|---|---|---|---|
| 6,160,280 A | * | 12/2000 | Bonn et al. | 257/272 |
| 6,566,930 B1 | | 5/2003 | Sato | |
| 7,253,064 B2 | * | 8/2007 | Chaine et al. | 438/296 |
| 7,358,789 B2 | * | 4/2008 | Kimura | 327/333 |
| 2001/0013795 A1 | | 8/2001 | Nojiri | |
| 2005/0134355 A1 | | 6/2005 | Maede et al. | |
| 2005/0285659 A1 | | 12/2005 | Kanno et al. | |

FOREIGN PATENT DOCUMENTS

| | | |
|---|---|---|
| JP | 2001-298356 | 10/2001 |
| JP | 2006-140884 | 6/2006 |

* cited by examiner

*Primary Examiner*—Dinh T. Le
(74) *Attorney, Agent, or Firm*—McDermott Will & Emery LLP

(57) ABSTRACT

In a level shift circuit, even when a power supply voltage of an input signal is reduced, a level shift operation is reliably performed without causing increase in circuit area and process costs. For a pair of n-type transistors which receive an input signal and a reverse signal of the input signal as a pair of complementary signals at their gates, respectively, a layout which allows reduction in unit gate width size is adopted. The layout configuration includes a plurality of divided rectangular doped regions which function as drains and sources and a plurality of gates arranged to align in a gate length direction with a gate width direction according with a short side direction of the doped regions. The gates are electrically connected with one another, the drains are electrically connected with one another, and the sources are electrically connected with one another.

9 Claims, 8 Drawing Sheets

LEVEL SHIFT CIRCUIT

CROSS-REFERENCE TO RELATED APPLICATION

This application claims priority under 35 U.S.C. §119(a) on Japanese Patent Application No. 2007-233654 filed on Sep. 10, 2007, the entire contents of which are hereby incorporated by reference.

BACKGROUND OF THE INVENTION

1. Field of the Invention

The present invention relates to a level shift circuit for converting a logic level, and more particularly relates to a circuit configuration for performing a low voltage operation with low power consumption.

2. Description of the Prior Art

As a known level shift circuit, for example, a latch type level shift circuit has been known. A level shift circuit of this type is shown in FIG. 1.

The level shift circuit of FIG. 1 includes two n-type transistors N51 and N52, cross-coupled two p-type transistors P51 and P52, and an inverter INV50. A gate of each of the p-type transistors P51 and P52 is connected to a drain of the other one of the p-type transistors P51 and P52. The inverter INV50 inverts an input signal IN and is operated by a low voltage supply VDD of, for example, 1.5 V or the like. Other devices than the inverter INV50 are devices at the high voltage side, which are operated by a high voltage supply VDD3 of, for example, 3.3 V or the like. The n-type transistors N51 and N52 have sources grounded and receive signals complementary to each other, i.e., an input signal IN and a reverse signal XIN of the input signal IN output from the inverter INV50, respectively. Each of the p-type transistors P51 and P52 has a source connected to the high voltage supply VDD3 and a gate connected in cross-coupling connection to a drain of the other one of the p-type transistors P51 and P52. Respective drains of the p-type transistors P51 and P52 are connected to respective drains of the n-type transistors N51 and N52, respectively. Assume that one connection point, i.e., a connection point of the p-type transistor P51 and the n-type transistor N51 is, a node W51 and the other connection point, i.e., a connection point of the p-type transistor P52 and the n-type transistor N52 is a node W52. An output signal OUT is output from the node W52.

The operation of the level shift circuit of FIG. 1 will be described. In a steady state, for example, when the input signal IN is at the H (VDD) level and the reverse signal XIN thereof is at the L (VSS) level, the n-type transistor N51 is ON, the n-type transistor N52 is OFF, the p-type transistor P51 is OFF, and the p-type transistor P52 is ON. One node W51 is at the L (VSS) level and the other node W52 is at the H (VDD3) level. In this steady state, since the n-type transistor N51 and the p-type transistor P51 are complementary to each other and the n-type transistor N52 and the p-type transistor P52 are complementary to each other, a current does not flow.

Thereafter, when the input signal IN is changed to the L (VSS) level and a state transition time starts, the n-type transistor N51 is turned OFF and the n-type transistor N52 is turned ON. Accordingly, a pass-through current flows from the high voltage supply VDD3 to the ground via the p-type transistor P52 and the n-type transistor N52 which are in an ON state, so that a potential of the node W52 starts dropping from the H (VDD3) level. When the potential of the node W52 drops to a level of VDD3-Vtp (Vtp is a threshold voltage of the p-type transistors P51 and P52) or less, the p-type transistor P51 starts to be turned ON and a potential of the node W51 (potential of the gate of the p-type transistor P52) is increased. Accordingly, a drain current in the p-type transistor P52 is reduced and the potential of the node W52 is further reduced.

Finally, the potential of the node W51 becomes the H (VDD3) level and the potential of the node W52 becomes the L (VSS) level. Accordingly, the pass-through current no longer flows therein, the output logic is reversed and a waiting state for a next input signal IN to be changed is started. In the description above, the case where the input signal IN is changed from the H level (VDD) to the L level (VSS) has been explained. The same operation also applies in a reversed case.

Another example of the level shift circuit is described, for example, in Patent Document 1.

(Patent Document 1) Japanese Patent No. 3477448

Assume that in the level shift circuit of FIG. 1, a current through each of the n-type transistors N51 and N52 at an ON operation is smaller than a current through each of the cross-coupled p-type transistors P51 and P52 at an ON operation. In this state, if the input signal IN is changed from "H" to "L", the output signal OUT can not be made to be "L". Therefore, the level shift circuit is not operated. Specifically, when the low voltage supply VDD is reduced to a low voltage, the driving ability of each of the n-type transistors N51 and N52 is reduced. Therefore, it becomes very difficult to ensure the operation of the level shift circuit at a low voltage.

To ensure a low voltage operation in such level shift circuit, for example, the following methods can be used.

I. An input voltage to the n-type transistors N51 and N52 is increased by an additional circuit such as a charge pump circuit.
  II. Injection conditions and the like for the n-type transistors N51 and N52 are changed to reduce a threshold voltage.
  III. The gate width size of the n-type transistors N51 and N52 is increased.

First, in Method I, an input voltage to the n-type transistors N51 and N52 is increased by an additional circuit, thereby preventing reduction in driving current ability of the n-type transistors N51 and N52. Thus, the lower-limit operation voltage of the level shifter circuit can be lowered. However, providing the additional circuit disadvantageously causes increase in circuit area.

Next, in Method II, the driving current ability of the n-type transistors N51 and N52 can be increased by reducing the threshold voltage of the n-type transistors N51 and N52, so that the lower limit operation voltage of the level shift circuit can be reduced. However, injection conditions and the like have to be changed and process costs are disadvantageously increased.

Finally, in Method III, the driving current ability of the n-type transistors N51 and N52 can be increased by increasing the gate width size, so that the lower limit operation voltage of the level shift circuit can be reduced. However, increasing a transistor size disadvantageously causes increase in circuit area.

The above-described problems are not limited to the level shift circuit having the configuration of FIG. 1. Similar problems occur in a flip-flop type level shift circuit described in Patent Document 1 or some other level shift circuit (of a charge-pump type or a current mirror type) having a configuration in which a pair of complementary signals, i.e., an input signal and a reverse signal thereof are received at gates, respectively.

SUMMARY OF THE INVENTION

The present invention has been devised to make a level shift circuit capable of reliably performing a level shift operation, even when a power supply voltage for an input signal is reduced, without casing increase in circuit area and process costs.

FIG. 8 is a graph showing the relationship between gate width size and threshold voltage for an n-type transistor. When a gate width of the n-type transistor is Wn1, a threshold voltage is Vt1. As described above, when the first power supply voltage VDD is reduced to a low voltage around a threshold voltage (Vt1) of the n-type transistors N51 and N52, a drain current in each of the n-type transistor N51 and the n-type transistor N52 is reduced. As a result, it becomes difficult to operate the level shift circuit.

However, as shown in FIG. 8, there occurs the phenomenon that as the gate width size of the n-type transistor is further reduced, the threshold is reduced. This phenomenon is called, in general, the reverse narrow property or the reverse narrow effect. The reverse narrow property prominently appears when the gate width size is about 1-2 µm or less.

According to the present invention, utilizing the reverse narrow property, the gate width size of the n-type transistors which receive a pair of complementary signals, respectively, is divided to reduced the unit gate width size, thereby reducing the threshold voltage of the n-type transistors. Thus, a low voltage operation of the level shift circuit can be realized without causing increase in circuit area and process costs.

Specifically, as a level shift circuit which receives an input signal and outputs an output signal obtained by converting a logic level of the input signal, the present invention provides a level shift circuit including: a low voltage side circuit unit, operated by a first power supply voltage, for outputting the input signal and a reverse signal of the input signal as a pair of complementary signals; and a high voltage side circuit unit, operated by a second power supply voltage that is higher than the first power supply voltage and including a pair of n-type transistors for receiving the pair of complementary signals output from the low voltage side circuit unit at their gates, respectively, for outputting the output signal.

In the level shift circuit, each of the pair of n-type transistors includes: a rectangular doped region which functions as drains and sources; and a plurality of gates arranged at the doped region to align in a gate length direction with a gate width direction according with a short side direction of the doped region, the gates are electrically connected with one another, the drains are electrically connected with one another, and the sources are electrically connected with one another, and when it is assumed that a rectangular region surrounds the doped region and the gates so as to touch the doped region and the gates, a total gate width is smaller, compared to a layout in which the gates are arranged in the rectangular region with a gate width direction according with a long side direction of the doped region, under a condition that a same gate length, a same gate protruding length from the doped region, a same doped region protruding length from the gates, and a same gate interval are given.

Alternatively, each of the pair of n-type transistors includes: a plurality of rectangular divided doped regions which function as drains and sources; and a plurality of gates arranged at each of the doped regions to align in a gate length direction with a gate width direction according with a short side direction of the doped region, and the gates are electrically connected with one another, the drains are electrically connected with one another, and the sources are electrically connected with one another.

According to the present invention, the plurality of gates are arranged at the rectangular doped region to align in the gate length direction with the gate width direction according with the short side direction of the doped region. As another option, the plurality of gates are arranged at each of the rectangular divided doped regions to align in the gate length direction with the gate width direction according with the short side direction of the doped region. With application of such layout, the unit gate width size of the n-type transistors can be reduced and thus, utilizing the above-described reverse narrow property, the threshold voltage of the n-type transistors can be reduced.

Thus, by using, as the pair of n-type transistors which receive an input signal and a reverse signal of the input signal as a pair of complementary signals, transistors whose threshold voltage is low, the n-type transistors can be operated in a desired manner and the level shift operation is reliably performed even when a voltage of the low voltage supply is reduced to a lower level. Moreover, there is no need to increase the gate width size of the n-type transistors or add an additional circuit and thus a layout area is not increased. Also, process changes such as injection condition change and the like are not needed. Therefore, increase in process costs can be suppressed.

According to the present invention, a level shift circuit which can reliably perform a stable level shift operation, even when a power supply voltage of an input signal is set to be a lower level, without causing increase in area and process costs can be achieved.

DESCRIPTION OF THE PREFERRED EMBODIMENTS

Hereafter, embodiments of the present invention will be described with reference to the accompanying drawings.

First Embodiment

Figure 1:
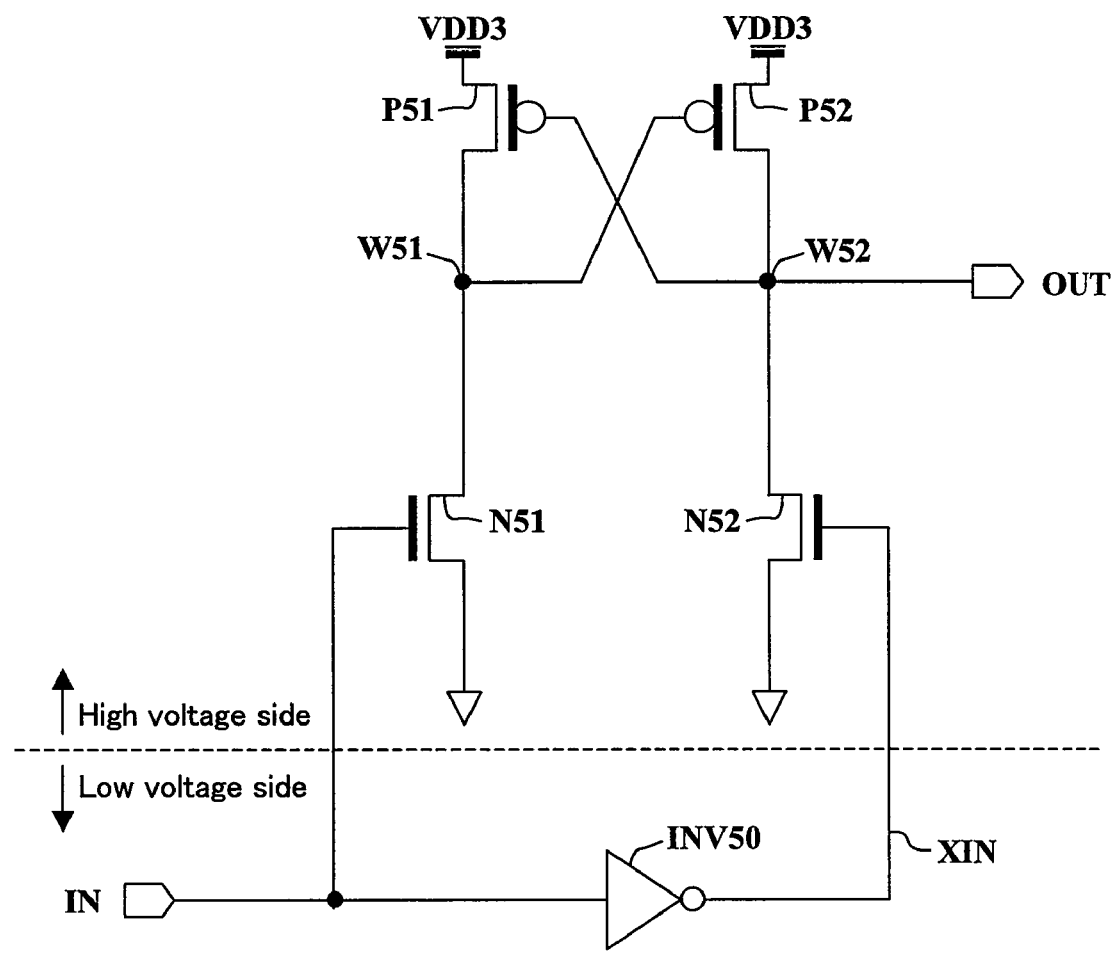
FIG. 1 is a diagram illustrating an exemplary configuration of a level shift circuit to which the present invention can be applied.

FIG. 1 is an exemplary configuration of a level shift circuit to which the present invention can be applied. The level shift circuit of FIG. 1 receives an input signal IN and outputs an output signal OUT obtained by converting a logic level of the input signal IN. A low voltage side circuit unit is operated by a first power supply voltage VDD and outputs the input signal IN and a reverse signal XIN of the input signal IN obtained by an inverter INV50 as a pair of complementary signals. A high voltage side circuit unit is operated by a second voltage VDD3 which is higher than the first power supply voltage VDD and includes n-type transistors N51 and N52 which receive the pair of complementary signals IN and XIN output from the low voltage side circuit unit at their gates, respectively. The detail operation of the level shift circuit is as described in the background of the invention and, therefore, the description thereof is omitted.

Note that the present invention is not limited to the level shift circuit having the configuration of FIG. 1 but is applicable to the flip-flop type level shift circuit described in Patent Document 1 or some other level shift circuit (of a charge pump type or a current mirror type). Specifically, the present invention is applicable to a level shift circuit which receives an input signal and outputs an output signal obtained by converting a logic level of the input signal and includes: a low voltage side circuit unit, operated by a first power supply voltage, for outputting the input signal and a reverse signal thereof as a pair of complementary signals; and a high voltage side circuit unit, operated by a second power supply voltage that is higher than the first power supply voltage and including a pair of n-type transistors which receive the pair of complementary signals output from the low voltage side circuit unit at their gates, respectively, for outputting the output signal.

Figure 2:
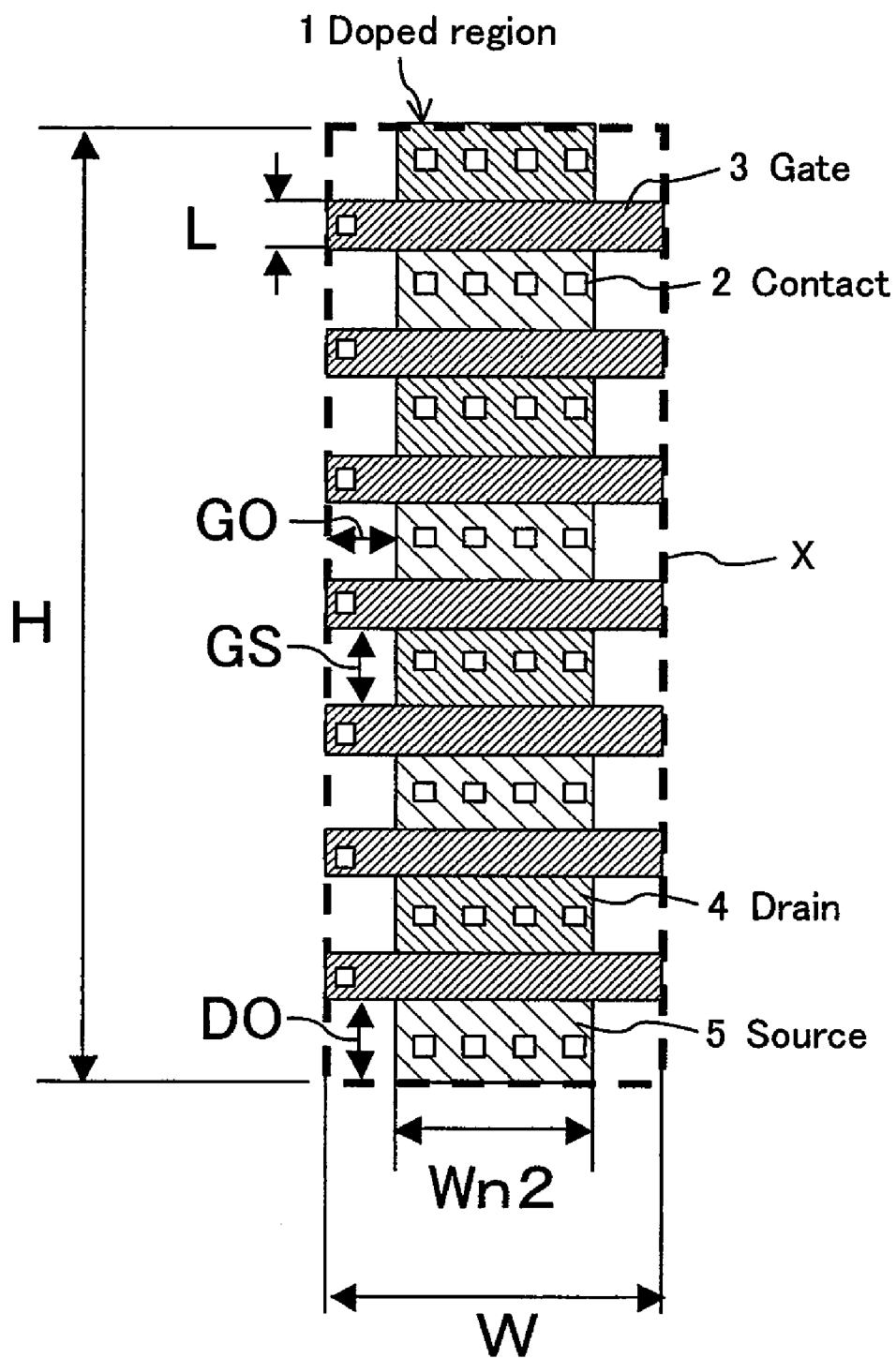
FIG. 2 is a view illustrating a layout configuration for an n-type transistor according to a first embodiment of the present invention.

FIG. 2 is a view illustrating a specific layout configuration for n-type transistors such as, for example, n-type transistors N51 and N52 in the level shift circuit of FIG. 1, which receive a pair of complementary signals, i.e., an input signal and a reverse signal thereof at their gates, respectively, according to this embodiment.

As shown in FIG. 2, each n-type transistor according to this embodiment includes a rectangular doped region 1 which functions as drains 4 and sources 5 and a plurality of gates 3 arranged to align in a gate length direction with a gate width direction according with a short side direction of the doped region 1. Contacts 2 for making connection with wires are formed in each of the drains 4 and the sources 5. The drains 4 are connected with one another via wires. The gates 3 are connected with one another via wires. The sources 5 are connected with one another via wires. A unit gate width size is indicated by Wn2.

In this embodiment, assume that a rectangular region X surrounds the doped region 1 and the gates 3 so as to touch the doped region 1 and the gates 3. Further assume that a width of the rectangular region X is indicated by W and a height thereof is indicated by H (H>W). In the layout of FIG. 2, a short side direction (width direction) of the rectangular region X is the gate width direction.

Figure 7:
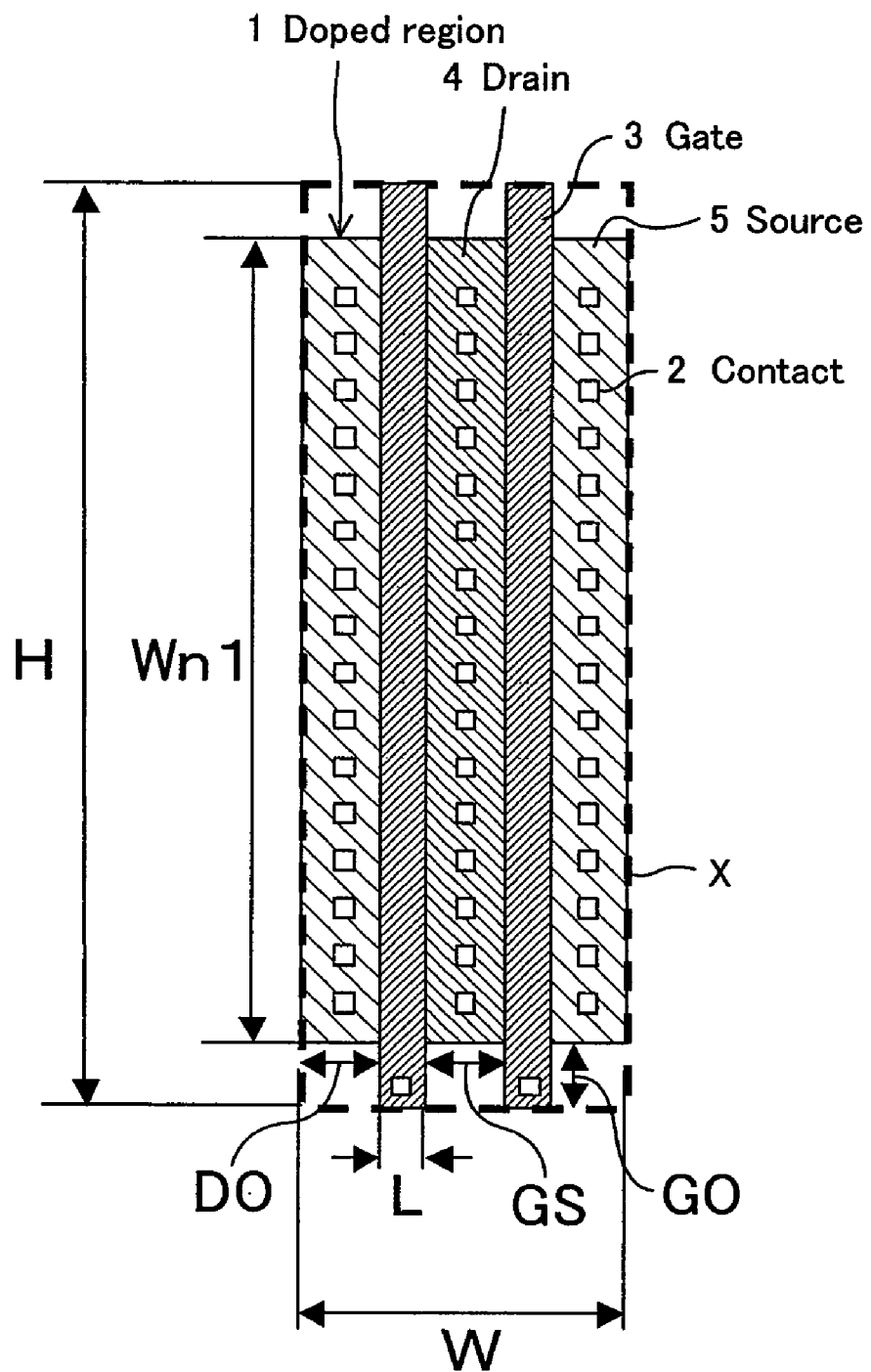
FIG. 7 is a view illustrating a layout configuration for an n-type transistor as a comparative example.

FIG. 7 is a view illustrating a layout configuration of an n-type transistor as a comparative example to this embodiment. Assume that a rectangular region X with a width W and a height H is given in the same manner as in FIG. 2. As shown in FIG. 7, to ensure as large a gate width size as possible, a layout is normally formed so that each gate extends in the height direction of the rectangular region X. That is, in the layout of FIG. 7, a long side direction (height direction) of the rectangular region X is the gate width direction. The unit gate width size is indicated by Wn1.

In contrast, according to this embodiment, when the rectangular region X with a width W and a height H (H>W) is given, to reduce the unit gate width size to a smaller size, as shown in FIG. 2, a layout is formed so that each gate extends in the width direction of the rectangular region X even if a total gate width size is reduced.

Assume that a gate length is L, a gate protruding length from the doped region is GO, a doped region protruding length from the gates is DO, and a gate interval is GS.

In the layout of FIG. 2, assuming that the number of gates is m, the total gate width of the n-type transistors is expressed by Wn2×m and $$Wn2 = W - 2 \times GO$$

$$m = \text{integer term of } \{(H - 2 \times DO - L)/(L + GS)\}$$

On the other hand, in the layout of FIG. 7, assuming that the number of gates is n, the total gate width of the n-type transistors is expressed by Wn1×n and $$Wn1 = H - 2 \times GO$$

$$n = \text{integer term of } \{(W - 2 \times DO - L)/(L + GS)\}$$

Under the condition that the same gate length L, the same gate protruding length GO from the doped region, the same doped region protruding length DO from the gates, and the same gate interval GS are given for the layouts of FIG. 7 and FIG. 2, there are cases where the total gate width in the layout of FIG. 2 is smaller than that of the layout of FIG. 7. That is, the following inequality holds:

$$Wn1 \times n \geq Wn2 \times m$$

Figure 8:
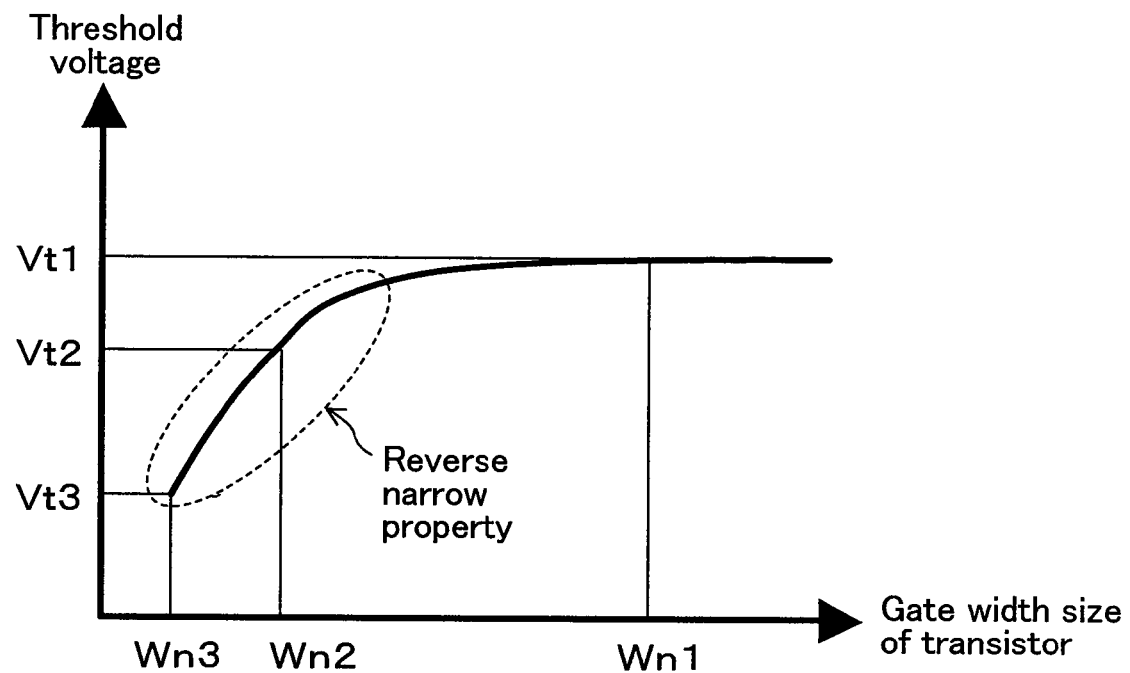
FIG. 8 is a graph showing the relationship between gate width size and threshold voltage for a transistor.

However, also in this case, a threshold voltage in the layout of FIG. 2 can be reduced by the reverse narrow property shown in FIG. 8, compared to the layout of FIG. 7. Even with a small total gate width, as the threshold voltage is reduced, the current ability of the n-type transistors is increased. Accordingly, the lower limit operation voltage can be further reduced. That is, in the layout of FIG. 2, the driving current ability of the n-type transistors at a low voltage is larger, so that the lower limit operation voltage of the shift level circuit can be reduced. Moreover, as described above, the lower limit operation voltage can be reduced even when the total gate width is small, and this means that an area necessary for the n-type transistors itself can be also reduced.

With application of the layout of this embodiment to the n-type transistors which receive a pair of complementary signals, respectively, even when a voltage of the low voltage supply is reduced to a lower level, the threshold of the n-type transistors is low and thus the n-type transistors can be operated in a desired manner. Accordingly, a level shift operation can be reliably performed. Moreover, there is no need to increase the gate width size of the n-type transistors or add an additional circuit and thus a layout area is not increased. Also, process changes such as injection condition change and the like are not needed. Therefore, increase in process costs can be suppressed.

Figure 3:
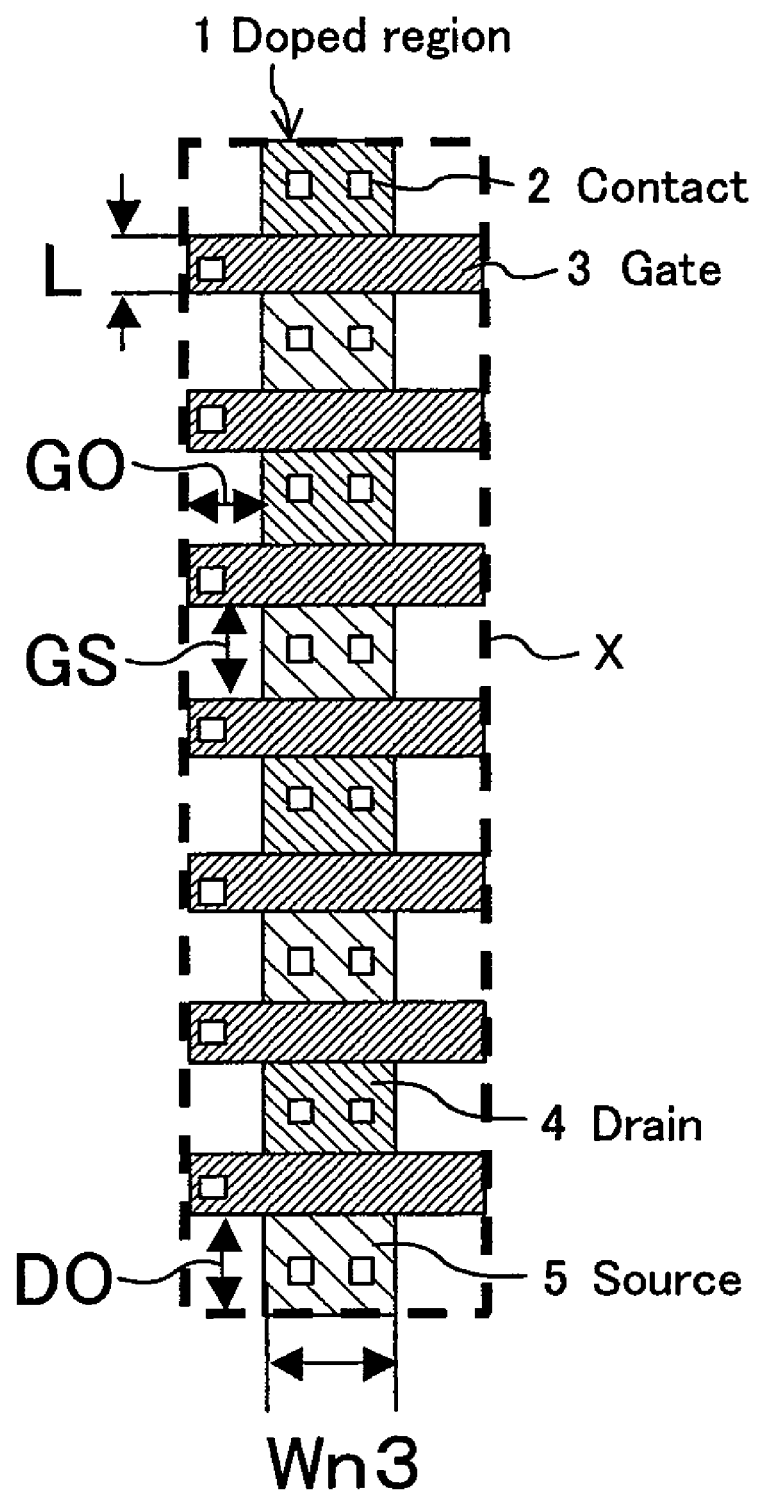
FIG. 3 is a view illustrating another exemplary layout configuration for an n-type transistor according to the first embodiment of the present invention.

FIG. 3 is a view illustrating another exemplary layout configuration according to this embodiment. The layout of FIG. 3 is substantially the same as the layout of FIG. 2 but, in FIG. 3, a unit gate width size Wn3 is smaller, compared to FIG. 2. The unit gate width size Wn3 can be reduced to a minimum gate width size that can ensure properties in fabrication process steps. In this case, the number of the contacts 2 formed in each of the drains 4 and the sources 5 is preferably 2 or less. By further reducing the unit gate width size Wn3, the threshold voltage of the n-type transistors can be further reduced. This allows the operation at a lower voltage.

Second Embodiment

Figure 4:
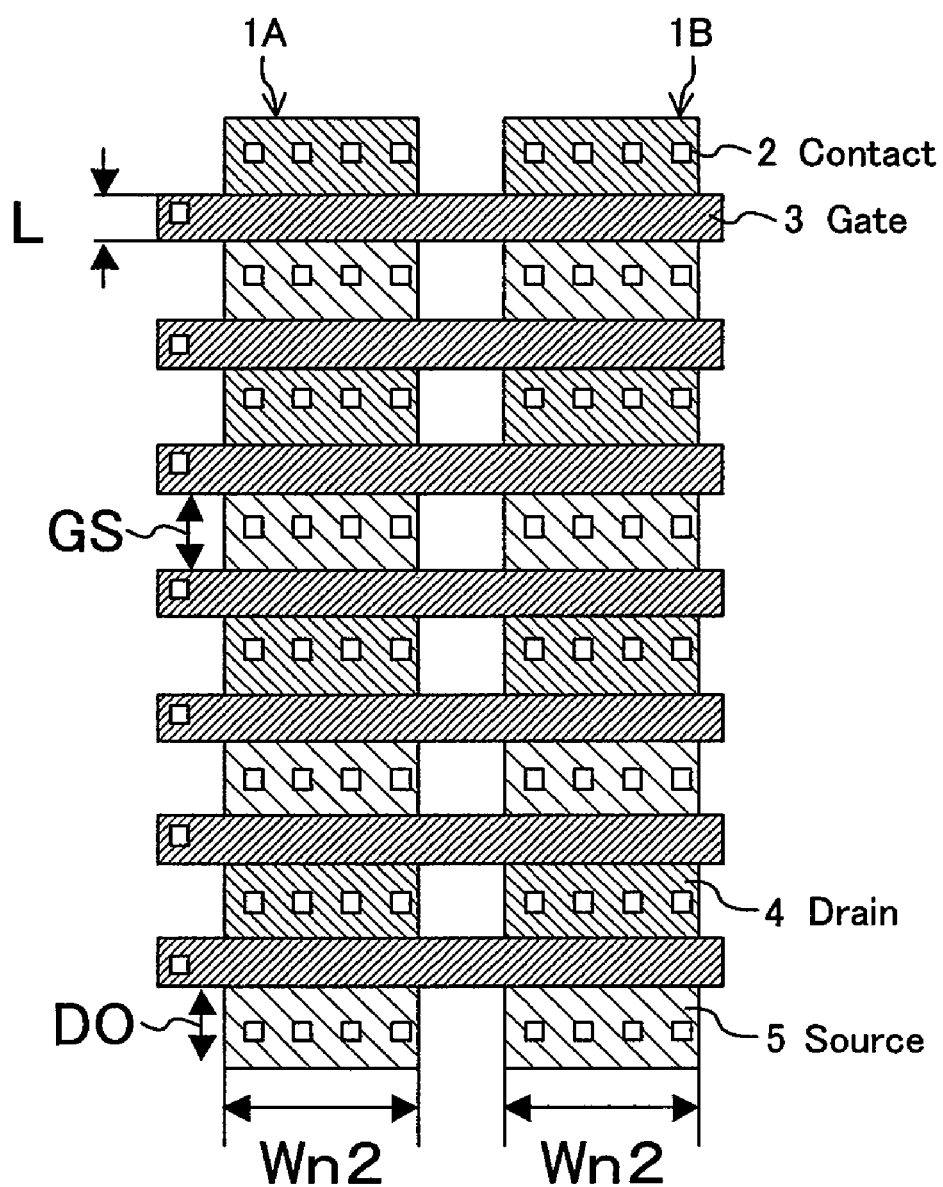
FIG. 4 is a view illustrating a layout configuration for an n-type transistor according to a second embodiment of the present invention.

FIG. 4 is a view illustrating a specific layout configuration for a pair of n-type transistors in a level shift circuit, which receive a pair of complementary signals at their gates, respectively, according to this embodiment.

As shown in FIG. 4, each n-type transistor according to this embodiment includes a plurality (2 in FIG. 4) of divided rectangular doped regions 1A and 1B which function as drains 4 and sources 5, and a plurality of gates 3 arranged to align in a gate length direction with a gate width direction according with a short side direction of the doped regions 1A and 1B. Contacts 2 for making connection with wires are formed in each of the drains 4 and the sources 5. The drains 4 are connected with one another via wires. The gates 3 are connected with one another via wires. The sources 5 are connected with one another via wires. A unit gate width size is indicated by Wn2.

In the layout of FIG. 4, assuming that the number of gates is m and the number of doped regions is 1, the total gate width of the n-type transistors is Wn2×m×1.

By dividing a doped region into a plurality of separate doped regions as in the layout of FIG. 4, the unit gate width size Wn2 can be made to be sufficiently small. Thus, utilizing the reverse narrow property shown in FIG. 8, the threshold voltage can be reduced, compared to the layout of FIG. 7. Accordingly, the current ability of the n-type transistors is increased, so that the lower limit operation voltage can be further reduced. That is, in the layout of FIG. 4, the driving current ability of the n-type transistor at a low voltage is larger and thus the lower limit operation voltage of the level shift circuit can be reduced.

Therefore, by applying the layout of this embodiment to the n-type transistors which receive a pair of complementary signals, because the threshold of the n-type transistors becomes low, the n-type transistors can be operated in a desired manner even when a voltage of the low voltage supply is set to be a lower voltage. Accordingly, a level shift operation can be reliably performed.

In the layout of FIG. 4, a doped region is divided into 2 separate doped regions. However, a doped region may be divided into 3 or more separate doped regions. Moreover, in the layout of FIG. 4, each of the gates arranged in the doped region 1A and an associated one of the gates arranged in the doped region 1B are formed on the same straight line to be united as a single one of the gates 3. However, each of the gates on each of the doped regions does not have to be formed on the same straight line with an associated one of the gates on the other one of the doped regions. Moreover, in the layout of FIG. 4, the doped regions 1A and 1B are arranged to align in the short side direction of the doped regions. However, the doped regions 1A and 1B may be arranged in a different manner.

Figure 5:
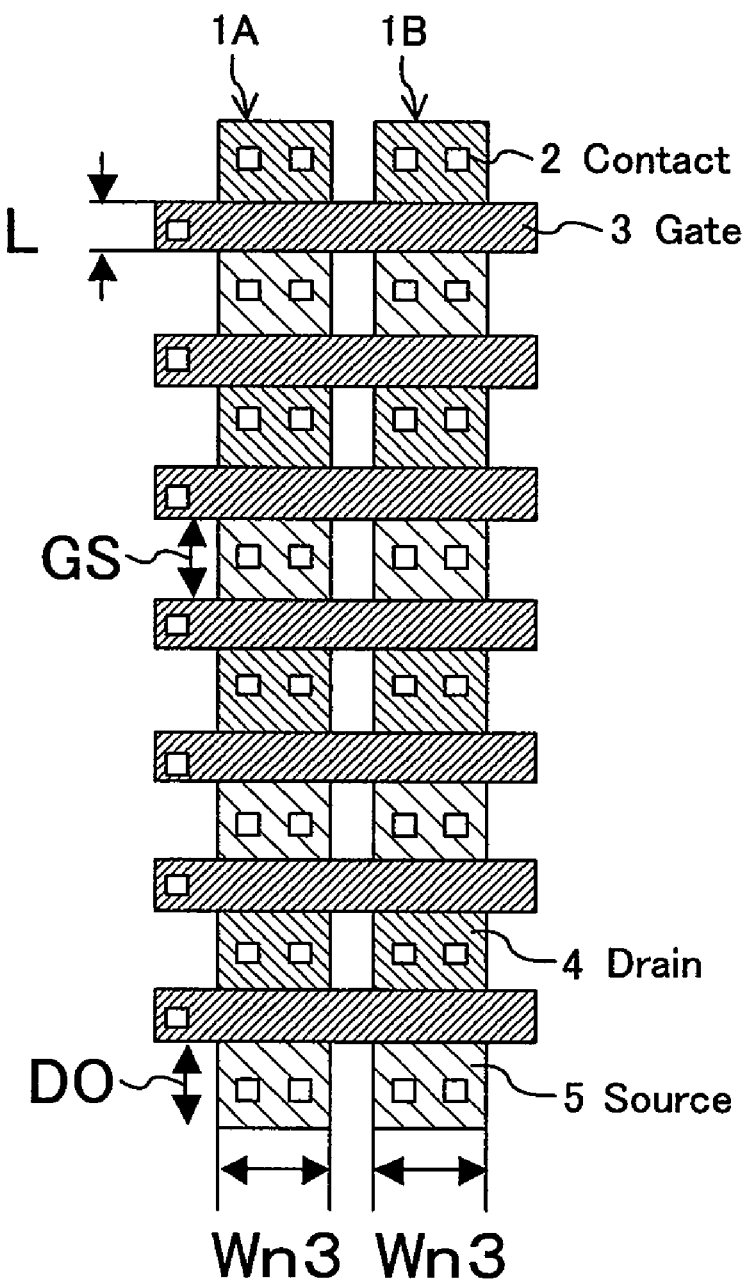
FIG. 5 is a view illustrating another exemplary layout configuration for an n-type transistor according to the second embodiment of the present invention.

FIG. 5 is a view illustrating another exemplary layout according to this embodiment. The layout of FIG. 5 is substantially the same as the layout of FIG. 4, but in FIG. 5, the unit gate width size Wn3 is smaller, compared to FIG. 4. The unit gate width size Wn3 can be reduced to a minimum gate width size that can ensure properties in fabrication process steps. In this case, the number of the contacts 2 formed in each of the drains 4 and the sources 5 is preferably 2 or less. By further reducing the unit gate width size Wn3, the threshold voltage of the n-type transistors can be further reduced. This allows the operation at a lower voltage.

Figure 6:
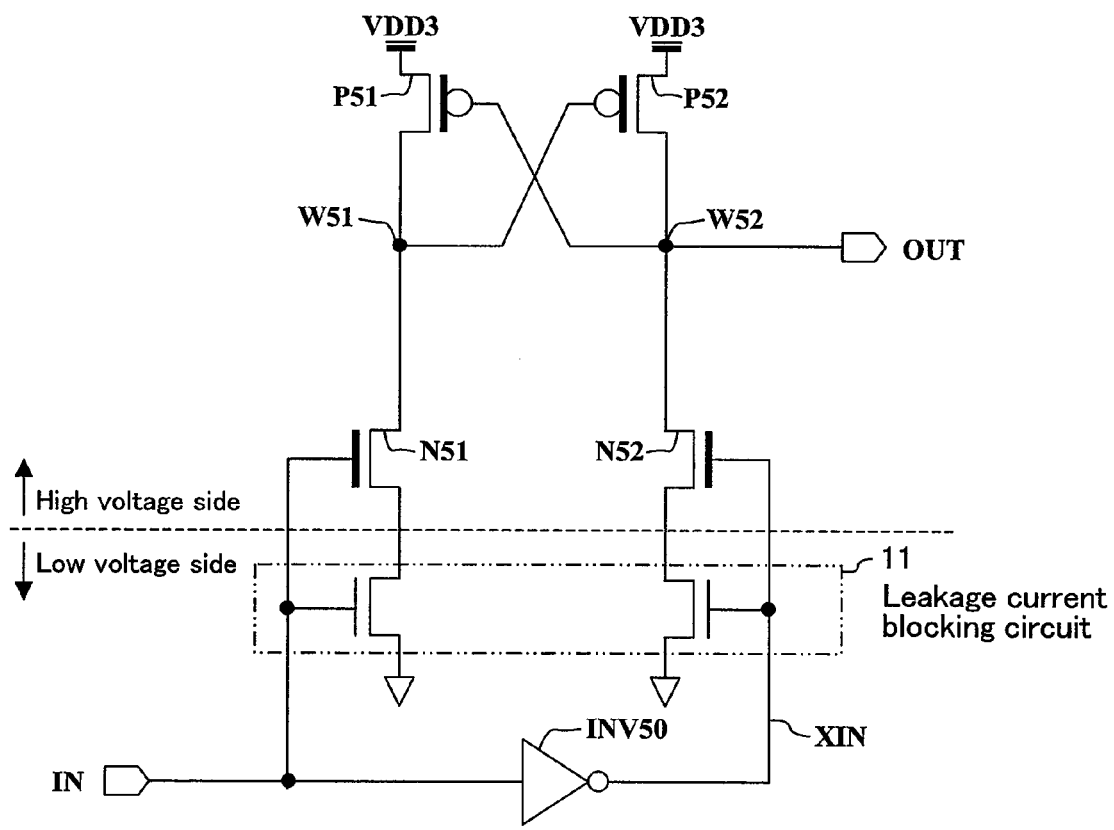
FIG. 6 is a modified example of a level shift circuit to which the present invention is applied.

With application of the layout described in each of the above-described embodiments, a leakage current in the n-type transistors might be increased. Therefore, as shown in FIG. 6, a leakage current blocking circuit 11 is preferably provided in the level shift circuit. When one of the n-type transistors N51 and N52 is turned OFF, the leakage current blocking circuit 11 operates to block a leakage current in the n-type transistor. In the configuration of FIG. 6, the leakage current blocking circuit 11 is provided at a closer point to a ground than each of the n-type transistors N51 and N52. However, the leakage current blocking circuit 11 may be provided at a closer point to a power supply than each of the n-type transistors N51 and N52.

It should be noted that each of the above-described embodiments is merely an example and does not limit the present invention. For example, the layout described in each of the above-described embodiments is not limited to the level shift circuit having the configuration of FIG. 1 but may be applied to a flip-flop type level shift circuit described in Patent Document 1 or some other level shift circuit (of a charge pump type or a current mirror type).

The present invention is useful in realizing a level shift circuit which can ensure its operation, while reducing power consumption, even when a voltage of a low voltage supply at an input signal side is reduced.

What is claimed is:

1. A level shift circuit which receives an input signal and outputs an output signal obtained by converting a logic level of the input signal, the level shift circuit comprising:
   a low voltage side circuit unit, operated by a first power supply voltage, for outputting the input signal and a reverse signal of the input signal as a pair of complementary signals; and
   a high voltage side circuit unit, operated by a second power supply voltage that is higher than the first power supply voltage and including a pair of n-type transistors for receiving the pair of complementary signals output from the low voltage side circuit unit at their gates, respectively, for outputting the output signal,
   wherein each of the pair of n-type transistors includes:
   a doped region which provides a plurality of drains and sources of the each of the pair of n-type transistor, the doped region having shorter sides along a first direction and longer sides along a second direction which is perpendicular to the first direction; and
   a plurality of gates arranged across the doped region, and aligning along the second direction which corresponds to a gate length direction, each of the plurality of gates extending along the first direction which corresponds to a gate width direction,
   the plurality of gates are electrically connected with one another, the plurality of drains are electrically connected with one another, and the plurality of sources are electrically connected with one another,
   the plurality of gates and the doped region are disposed in a rectangular area having a width W along the first direction and a height H along the second direction,
   the plurality of gates are arranged so that a total gate width which is a sum of gate widths of the plurality of gates disposed over the doped region is smaller than a sum of gate widths of a hypothetical n-type transistor, wherein the hypothetical n-type transistor includes at least one drain and at least one source provided in a hypothetical doped region, and at least two gates each extending along the second direction, aligning along the first direction and disposed across the hypothetical doped region, the hypothetical doped region and the at least two gates are disposed in a rectangular area having the width W along the first direction and the height H along the second direction, and the at least one drain, at least one source and at least two gates are arranged under the same design rule as the each of the pair of n-type transistors, and the design rule defines at least one of a gate length, a gate protruding length from the dopes region, a space between the gates and a width of source and drain.

2. The level shift circuit of claim 1, wherein contacts are formed in each of the plurality of drains and each of the plurality of sources, and the number of the contacts formed in each of the drains and the sources is 2 or less.

3. The level shift circuit of claim 1, further comprising a leakage current blocking circuit for blocking coupled to the pair of n-type transistors, when one of the pair of n-type transistors is turned OFF, a leakage current in said one of the n-type transistors.

4. A level shift circuit which receives an input signal and outputs an output signal obtained by converting a logic level of the input signal, the level shift circuit comprising:

a low voltage side circuit unit, operated by a first power supply voltage, for outputting the input signal and a reverse signal of the input signal as a pair of complementary signals; and a high voltage side circuit unit, operated by a second power supply voltage that is higher than the first power supply voltage and including a pair of n-type transistors for receiving the pair of complementary signals output from the low voltage side circuit unit at their gates, respectively, for outputting the output signal, wherein each of the pair of n-type transistors includes:

a plurality of doped regions including a first doped region and a second doped region, the first and second doped regions providing a plurality of drains and sources of the each of the pair of n-type transistors, the drains and the sources being arranged alternately, the first and second doped regions being disposed adjacent to each other, with a space therebetween, in a first direction, and extending in a second direction perpendicular to the first direction; and a plurality of gates each extending in the first direction and aligning in the second direction, each of the plurality of gates being disposed over the first and second doped regions, areas of the first doped region between the adjacent gates serve either the drains or the sources, respectively, and areas of the second doped region between the adjacent gates serve either the drains or the sources, and the plurality of gates are electrically connected with one another, the drains are electrically connected with one another, and the sources are electrically connected with one another.

5. The level shift circuit of claim 4, wherein each of the plurality of doped regions has shorter sides and longer sides, and arranged to align in a direction of the shorter sides of the doped regions.

6. The level shift circuit of claim 5, wherein each of the gates arranged in the first doped region and an associated one of the gates arranged in the second doped region are formed on a same straight line.

7. The level shift circuit of claim 4, wherein contacts are formed in each of the plurality of drains and each of the plurality of sources, and a number of contacts formed in each of the drains and the sources is 2 or less.

8. The level shift circuit of claim 4, further comprising a leakage current blocking circuit for blocking coupled to the pair of n-type transistors, when one of the pair of n-type transistors is turned OFF, a leakage current in said one of the n-type transistors.

9. A level shift circuit which receives an input signal and outputs an output signal obtained by converting a logic level of the input signal, the level shift circuit comprising:

a low voltage side circuit unit, operated by a first power supply voltage, for outputting the input signal and a reverse signal of the input signal as a pair of complementary signals; and a high voltage side circuit unit, operated by a second power supply voltage that is higher than the first power supply voltage and including a pair of n-type transistors for receiving the pair of complementary signals output from the low voltage side circuit unit at their gates, respectively, for outputting the output signal, wherein each of the pair of n-type transistors includes:

a doped region which provides a plurality of drains and sources of the each of the pair of n-type transistor, the doped region having shorter sides along a first direction and longer sides along a second direction which is perpendicular to the first direction; and a plurality of gates arranged across the doped region, and aligning along the second direction which corresponds to a gate length direction, each of the plurality of gates extending along the first direction which corresponds to a gate width direction, the plurality of gates are electrically connected with one another, the plurality of drains are electrically connected with one another, and the plurality of sources are electrically connected with one another, and the plurality of gates and the doped region are disposed in a rectangular area having a width W along the first direction and a height H along the second direction, the plurality of gates and the doped region are arranged in the rectangular area so that the each of the pair of n-type transistors has a lower threshold voltage than other gate and doped region arrangements in the rectangular area under a common design rule which defines at least one of a gate length, a gate protruding length from the dopes region, a space between the gates and a width of source and drain.

* * * * *

UNITED STATES PATENT AND TRADEMARK OFFICE
CERTIFICATE OF CORRECTION

| | | |
|---|---|---|
| PATENT NO. | : 7,737,756 B2 | Page 1 of 1 |
| APPLICATION NO. | : 12/177614 | |
| DATED | : June 15, 2010 | |
| INVENTOR(S) | : Shiro Usami | |

It is certified that error appears in the above-identified patent and that said Letters Patent is hereby corrected as shown below:

ON THE TITLE PAGE OF THE PATENT:

Insert Item --(30) Foreign Application Priority Data

September 10, 2007   (JP)........2007-233654-- after "PRIOR PUBLICATION DATA" and prior to "(51) INT. CL."

Signed and Sealed this

Twelfth Day of October, 2010

David J. Kappos
*Director of the United States Patent and Trademark Office*